(12) United States Patent
Cook

(10) Patent No.: US 6,514,031 B1
(45) Date of Patent: Feb. 4, 2003

(54) MATERIAL-HANDLING VEHICLE

(75) Inventor: David Allan Cook, Cheadle (GB)

(73) Assignee: J. C. Bamford Excavators Limited, Staffordshire (GB)

( * ) Notice: Subject to any disclaimer, the term of this patent is extended or adjusted under 35 U.S.C. 154(b) by 0 days.

(21) Appl. No.: 09/289,496

(22) Filed: Apr. 9, 1999

(30) Foreign Application Priority Data

Apr. 9, 1998 (GB) ............................................ 9807539

(51) Int. Cl.[7] ................................................ B66F 13/00
(52) U.S. Cl. .................. 414/685; 180/297; 180/377
(58) Field of Search ............................. 414/685, 680;
180/377, 297, 292, 291, 248

(56) References Cited

U.S. PATENT DOCUMENTS

| 3,580,350 A | * | 5/1971 | Arkus-Duntov | ......... 180/297 X |
| RE30,021 E | | 6/1979 | Olson et al. | |
| 4,763,543 A | | 8/1988 | Harada et al. | |
| 5,143,167 A | * | 9/1992 | Moriyama et al. | ...... 180/297 X |
| 5,348,516 A | * | 9/1994 | Shibata | ................... 180/297 X |
| 5,687,809 A | * | 11/1997 | Braud | .................... 180/292 X |
| 5,836,733 A | | 11/1998 | Moses et al. | |

FOREIGN PATENT DOCUMENTS

| CA | 2009968 | 8/1991 |
| DE | 27 39 537 A1 | 3/1978 |
| DE | 240 869 A1 | 11/1986 |
| EP | 0 656 315 A1 | 11/1994 |
| GB | 896 542 A | 5/1962 |
| GB | 2 291 384 A | 1/1996 |
| WO | WO 89/00972 | 2/1989 |

* cited by examiner

Primary Examiner—Donald W. Underwood
(74) Attorney, Agent, or Firm—Marshall, Gerstein & Borun

(57) ABSTRACT

A material handling vehicle including a structure having, ground engageable propulsion means, a loader arm mounted for up and down swinging movement, an operator's cab, an engine having an output to provide power for said movement of the loader arm and propulsion of the vehicle and a drive to connect the output to the ground engageable propulsion means to propel the vehicle.

57 Claims, 5 Drawing Sheets

MATERIAL-HANDLING VEHICLE

BACKGROUND TO THE INVENTION

This invention relates to a material-handling vehicle of the kind, hereinafter referred to as the "kind specified", including a structure having, ground engageable propulsion means, a loader arm mounted for up and down swinging movement, an operator's cab, an engine having an output to provide power for said movement of the loader arm and propulsion of the vehicle and a drive to connect the output to the ground engageable propulsion means to propel the vehicle.

Description of the Prior Art

One vehicle of the kind specified is disclosed in U.S. Pat. No. Re-30,021. In this machine, which is relatively large, the loader arm is substantially horizontal but is angled downwardly in the forward direction, is partly accommodated in a well provided between the cab and a load carrying platform disposed on the opposite side of the loader arm to the operator's cab. As a result the loader arm, in a fully lowered position, is disposed below a horizontal plane containing the top of a steering wheel in the operator's cab so that the driver's vision is substantially unobstructed. This vehicle is sufficiently large that an upright engine to provide power for swinging movement of the arm and propulsion of the vehicle can be accommodated beneath the well on the centre line of the vehicle.

WO-A-89/00972, CA-A-2,009,968 and EP-A-0,656,315 discloses vehicles of the kind specified in which a loader arm, in a fully lowered position, is similarly substantially horizontal, although the precise angle of the loader arm varies in the three above referred to specifications, and is at least partly accommodated in a well disposed between the operator's cab and a housing in which the engine is disposed. The loader arm is disposed so it does not, at least substantially, interfere with the view of the operator in this direction.

A vehicle configuration as disclosed in these three references, in which the engine is offset to be on the opposite side of the loader arm to the cab, enables the vehicle to be made smaller than the vehicle of U.S. Pat. No. Re-30021 and enables the overall height of the vehicle to be reduced.

DE-A-2,739,537 discloses another vehicle of the kind specified but in which the loader arm, in its lowered position is disposed so that the loader arm is entirely above the level of the top of the engine and its associated housing. Accordingly the vehicle is unprovided with any well so that in a lowered position the loader arm extends alongside the operator's cab substantially above the bottom of a side window therein so that the driver's view transversely of the vehicle is obstructed.

All the above mentioned vehicles suffer from one or other disadvantage.

In U.S. Pat. No. Re-30,021 because of the disposition of the engine underneath the loader arm the operator's cab is required to be relatively high so that the operator can still see over the top of the loader arm whilst providing sufficient space beneath the loader arm for the accommodation of the engine and access to the engine is restricted.

In WO-A-89/00,972 the engine is arranged with the crank shaft thereof longitudinally of the vehicle. Access to the side of the engine adjacent to the cab is obstructed by the presence of the cab and the wheel base of the vehicle must be relatively large to accommodate the longitudinal extent of the engine between the wheels. A short wheel base is desirable as it improves manoeuvrability of the vehicle, which is important for operating in confined spaces. In a vehicle of the type described in this specification and as marketed by the applicant in respect of WO-A-89/00,972 a hydro-static drive is provided to transfer drive transversely from the engine towards the ground engageable means.

In CA-A-2,009,968 the engine is also arranged with its crank shaft longitudinally of the vehicle and so suffers from the disadvantages mentioned in the preceding paragraph. In this case a mechanical drive is provided to transfer drive transversely from the engine towards the ground engageable means.

DD A 240 869 discloses a drive for a mechanical handling vehicle of the kind specified in which the engine is disposed with its crank shaft transversely of the vehicle and an angle gear drive is provided to transfer drive through 90° from the engine towards the ground engageable means.

In EP-A-0,656,316 the engine is also disposed with its crank shaft transversely of the vehicle and an angle gear drive is provided to transfer drive through 90° from the engine towards the ground engageable means.

These vehicles suffer from the disadvantage of the need to provide a relatively expensive angle gear drive and associated engineering problems to turn the drive through 90°.

In DE-A-2,739,537 the driver's view transversely across the vehicle is obstructed because of the absence of a well to accommodate the loader arm.

SUMMARY OF THE INVENTION

An object of the present invention is to provide a material-handling vehicle of the kind specified whereby the above mentioned problems are overcome or are reduced.

According to the present invention we provide a material handling vehicle of the kind specified wherein the output of engine is kinematically connected to an input of a transmission unit which include a change-speed gear train, the output of the engine and the input of the transmission unit being disposed transversely of the vehicle.

The transmission unit may be provided with at least one output which is kinematically connected to said ground engageable propulsion means.

The or each output of the transmission unit may be rotatable about an axis which extends longitudinally of the vehicle.

The change speed gear train may have an output shaft which is disposed transversely of the vehicle and which drives an angle drive having an output which extends longitudinally of the vehicle.

The angle drive may comprise a first bevel gear mounted for rotation about an axis which extends transversely of the vehicle and which is in mesh with a second bevel gear which is mounted for rotation about an axis which extends longitudinally of the vehicle.

The at least one output of the transmission unit may be provided at one end of an output shaft which is connected to said second bevel gear.

The transmission unit may have a front output and a rear output.

Said outputs of the transmission unit may be provided at opposite ends of said output shaft.

The transmission unit may be provided with a clutch or a torque converter or the like.

The clutch or torque converter or the like may be provided on the input side of the transmission unit.

The clutch or torque converter or the like may be provided between the engine and the ground engageable propulsion means.

The vehicle may comprise a front axle and a rear axle each having a ground engageable propulsion means and the propulsion means of at least one of said axles being connected to said at least one output of the transmission unit.

At least one of said axles may have a differential which is connected to said at least one output of the transmission unit.

The connection of the or each output of the transmission unit to at least one of said axles may comprise a shaft which may have a universal joint at least at one end.

The transmission unit may be disposed substantially centrally of the vehicle.

The engine may be located on the opposite side of the loader arm longitudinal axis to the cab.

The engine may be spaced from the cab to define a well between the cab and the engine in which the arm, in a lowered position, can be at least partly accommodated.

The vehicle may comprise a chassis having a pair of spaced longitudinally extending frame members.

The engine may be disposed substantially on the opposite side of the chassis to the cab.

The frame members may be parallel to each other.

At least one of the chassis side members may be relieved locally to clear at least one of the engine transmission or associated component.

Mounting means may be provided between the chassis and at least one of the engine and transmission unit.

The mounting means may comprise compliant mounts.

The longitudinal axis of the loader arm may extend forwardly in, or parallel to a vertical plane containing a longitudinal axis of the vehicle.

The structure may have a front end and a rear end with said longitudinal axis of the vehicle extending therebetween and the ground engageable propulsion means being disposed equi-distant from, and on opposite sides of, said longitudinal axis.

The loader arm may be pivotally mounted towards the rear of the vehicle about a horizontal axis.

The loader arm may carry a material handling implement at its front end so that the material handling implement is disposed in front of the front of the structure when the arm is in its lowermost position.

The cab may have a side window which faces transversely across the vehicle at right angles to the longitudinal axis of the loader arm.

The top of the loader arm in a fully lowered position and at a position alongside the top of a steering wheel in the operator's cab may be disposed wholly or substantially wholly below a horizontal plane which is not more than 1 meter, or preferably not more than 0.5. meter, above the top of the steering wheel so that the driver's vision is substantially unobstructed by the loader arm.

If desired, the top of the boom at said position may be wholly or substantially wholly below a horizontal plane containing the top of the steering wheel.

The loader arm may be telescopic in the direction of the longitudinal axis of the loader arm.

The longitudinal axis of the loader arm may in a substantially horizontal plane when the loader arm is in a position in which the implement engages a horizontal plane on which the ground engageable propulsion means are supported and, if the loader arm is telescopic, the loader arm is fully retracted.

The engine may be disposed so that a major portion of the engine is situated below a plane tangent to the top of the ground engaging propulsion means so as not to interfere with the view of an operator working in the operator's cab.

The ground engageable propulsion means may be driven from the engine wholly by a mechanical transmission or a hydrokinetic transmission.

The ground engageable propulsion means may comprise a pair of ground engageable wheels disposed adjacent the front of the structure and a pair of rear ground engageable wheels adjacent the rear of the structure.

The wheels of the front pair may be driven from a first output shaft of the gearbox whilst the wheels of the rear pair may be driven by a second output shaft of the gearbox.

BRIEF DESCRIPTION OF THE DRAWINGS

The invention will now be described by way of example with reference to the accompanying diagrammatic drawings in which.

DESCRIPTION OF THE PREFERRED EMBODIMENTS

Figure 1:
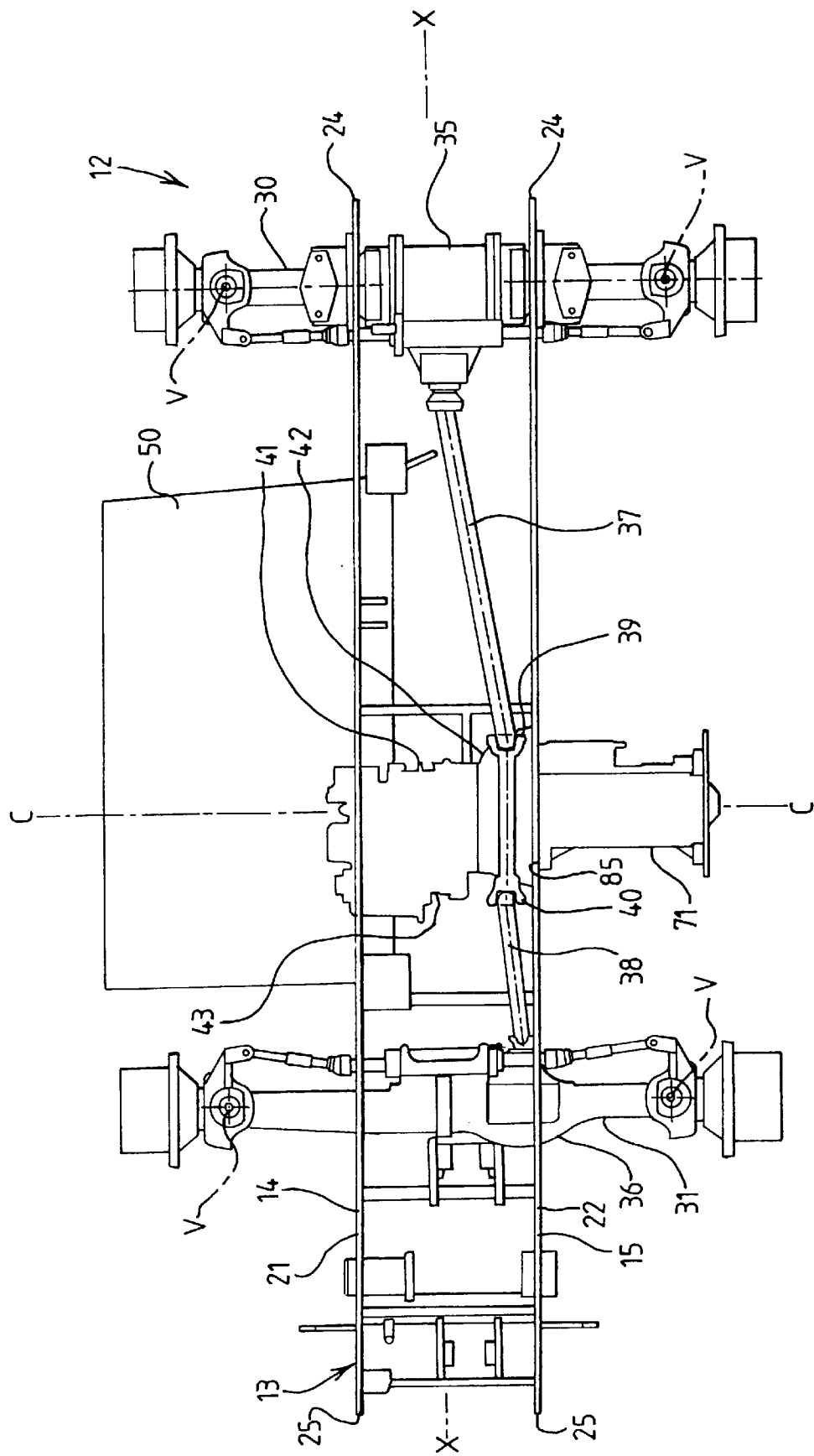
FIG. 1 is a fragmentary plan view of a telescopic loader vehicle embodying the invention.

Referring to the Figures, a material-handling vehicle is indicated generally at 10 and comprises a main structure 11 having a front end 12 and a rear end 13 with a longitudinal axis X—X extending between the front and rear ends. The structure 11 comprises a pair of spaced parallel frame members 14, 15 held in spaced parallel relationship by cross members.

Each frame member 14, 15 has a upper surface 21, 22 respectively. At the front and rear, the frame members 14, 15 have generally upright parts 24, 25 respectively whilst on their undersides they have a lower surface one of which is shown at 27. The right-hand frame member 15 has an upwardly relieved part 28 to provide clearance for an engine and a transmission unit as hereinafter to be described.

A front axle 30 is mounted on the frame members 14, 15 at the front end thereof whilst a rear axle 31 is mounted on the frame members 15 towards the rear thereof. The axles 30, 31 are of conventional type carrying at their opposite ends front wheels 33 and rear wheels 34 respectively. Both the front wheels 33 and both rear wheels 34 are pivotable relative to their associated axis about a steering axis V for steering movement of the vehicle, as shown in chain dotted line in FIG. 1. If desired at least one of the axles may be mounted relative to the frame members 14, 15 for oscillation about a longitudinally extending axis. Each axle 30, 31 is provided with a differential 35, 36 respectively of conventional form, the differentials being driven by propeller shafts 37, 38 respectively from front and rear outputs 39, 40 respectively of a transmission unit 43 incorporating a change speed gear train disposed in a gear box section 41 thereof and a torque converter 42. If desired the torque converter may be omitted or provided in some other suitable manner in the drive train or other means for disconnecting drive when the vehicle is stationary may be provided. The transmission unit 43 also can be a wholly mechanical transmission or a wholly hydrokinetic transmission.

Figure 2:
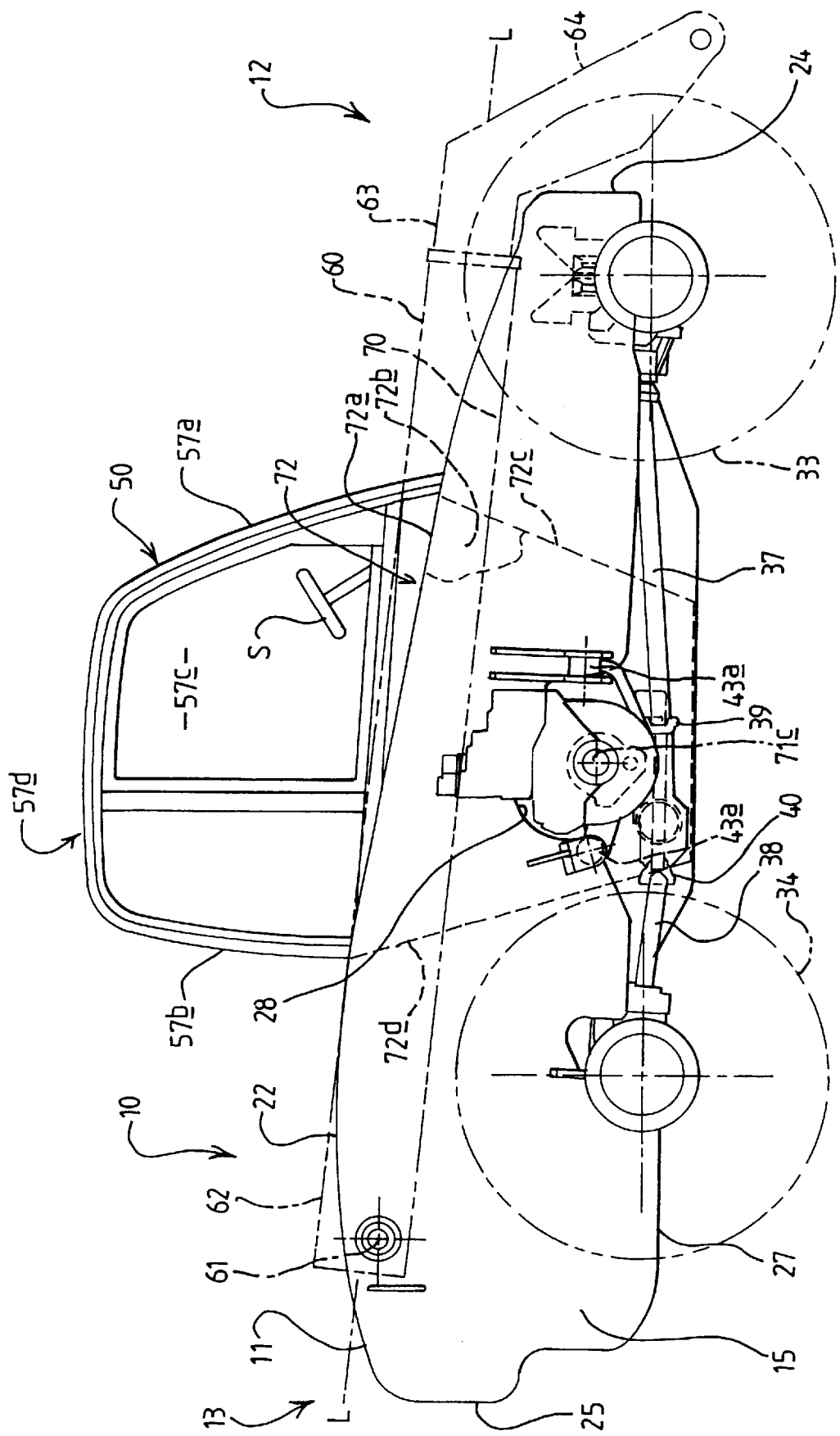
FIG. 2 is a fragmentary side elevation of the vehicle of FIG. 1.
Figure 4:
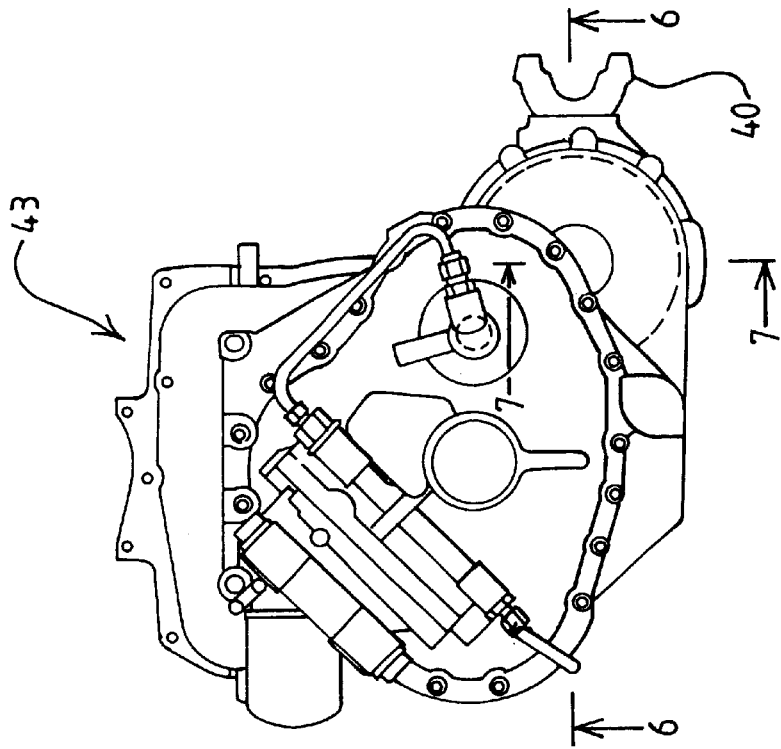
FIG. 4 is an end view of the transmission unit of FIG. 3 looking in the direction of the arrow A.
Figure 3:
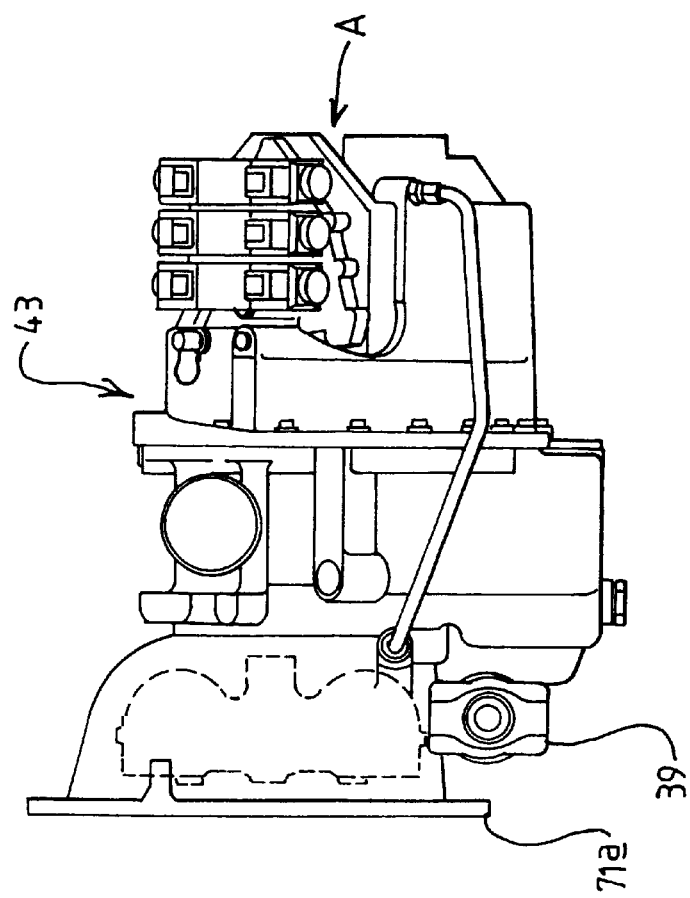
FIG. 3 is a side view of a transmission unit for use in the vehicle of FIG. 1.
Figure 5:
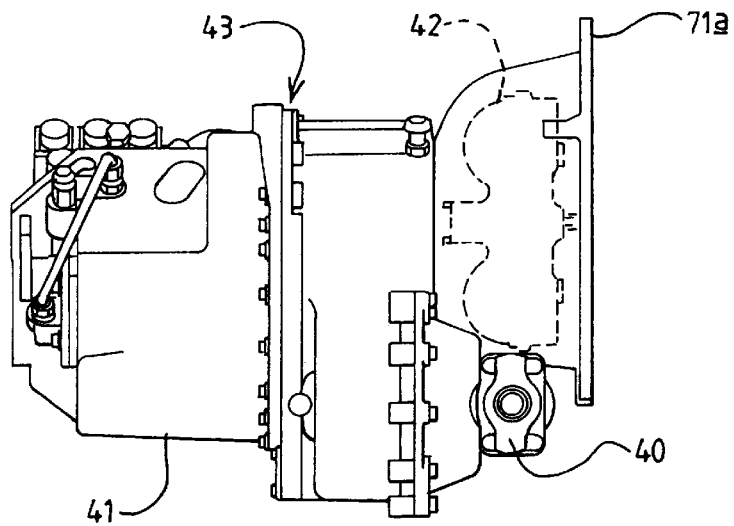
FIG. 5 is a side view of the transmission unit of FIG. 3 taken from the opposite side to that shown in FIG. 3.
Figure 6:
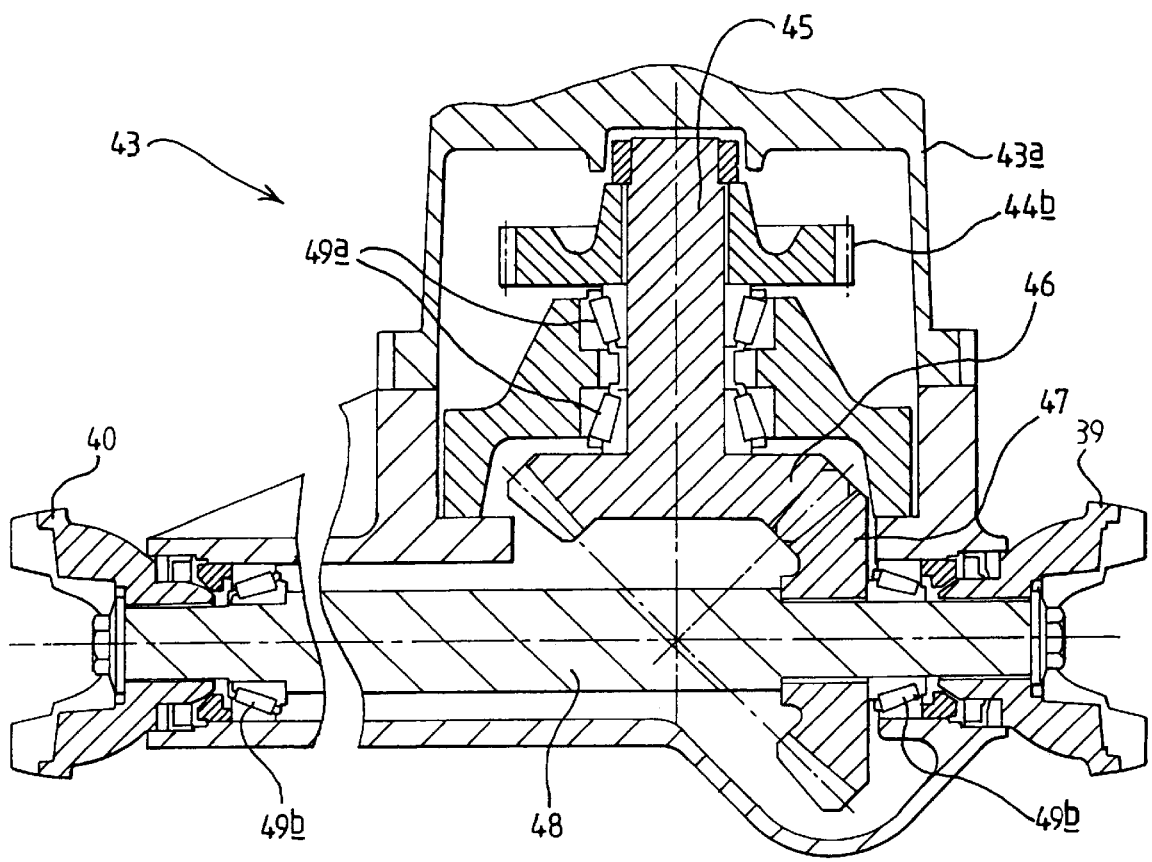
FIG. 6 is a section on the line 6—6 of FIG. 4
Figure 7:
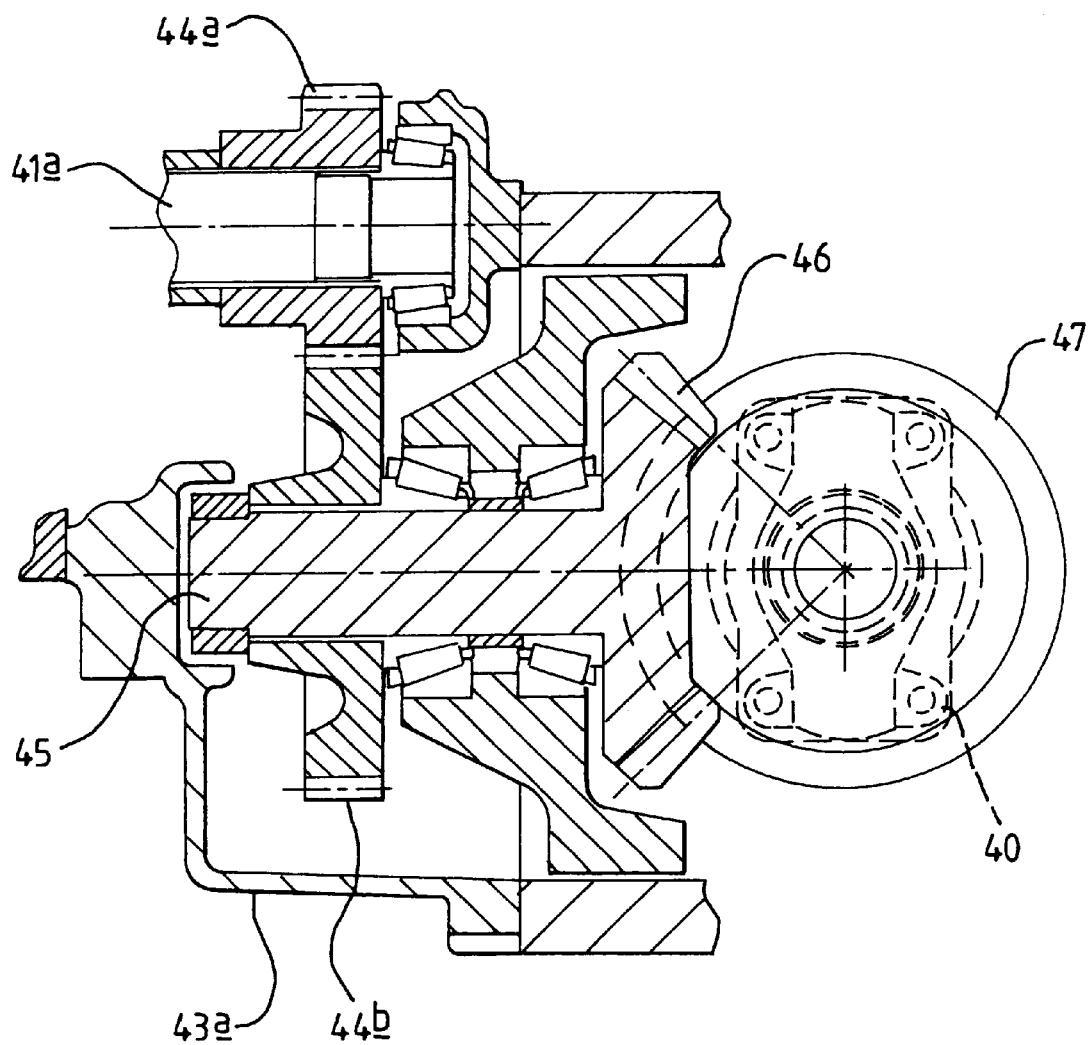
FIG. 7 is a section on the line 7—7 of FIG. 4.

The transmission unit 43 is mounted on the frame members 14, 15 by compliant mounts only two of which are shown at 43a in FIG. 2, for clarity. The transmission unit 43 is disposed essentially between the frame members 14, 15 and disposed so that an end face 71a of the transmission unit is bolted to an engine 71 so that an output of the engine drives the torque converter 42.

The transmission unit 43 comprises the torque converter 42 which provides an input to an input shaft, not shown, of the change speed gear train 41 which is of a conventional type. An output shaft 41a of the gear train 41 has a pinion 44a which meshes with a pinion 44b splined to an intermediate shaft 45 which has a first bevel gear 46 formed integrally therewith. The bevel gear 46 meshes with a second bevel gear 47 splined to an output shaft 48 which provides the forward and rearward output 39, 40 respectively. The outputs 39, 40 are beneath the torque converter 42 and so are disposed at the end of the transmission to be adjacent to the engine. The shafts 45 and 48 are carried in a housing 43a of the transmission unit 43 by bearings 49a, 49b.

An operator's cab 50 is mounted on the frame member 14 by vibration isolating mounts so that the cab 50 is supported on one side of the longitudinal axis X—X of the vehicle. The cab 50 has a front window 57a a rear window 57b and two side windows 57c, 57d, the window 57c facing transversely across the machine. The or each window may be provided with a transparent closure element such as glass, or may be open, or may be provided with a protective element such as a grille or bars. A driver's seat, steering wheel S and other controls, not shown, are provided in the cab and the cab is provided with an access door or opening on the side in which the window 57d is provided.

A loader arm 60, having a longitudinal axis L—L which lies in a vertical plane parallel to a vertical plane containing the longitudinal axis X—X of the vehicle, is pivotally mounted, by means of an axis member 61, between the frame members 14, 15 at the rear 13 of the vehicle for pivotal up and down swinging movement about a horizontal axis H. The loader arm 60 is telescopic and comprises a rear outer section 62 which is pivotally connected to the frame members 14 and 15 by the axis 61 and a forward inner member 63 which is telescopically slidable with the section 62 under the control of hydraulic rams in conventional manner in the direction of the longitudinal axis L—L. At its front end the part 63 is provided with a downwardly and forwardly extending part 64 adapted to carry a material handling implement such as a loader bucket or lifting forks or other desired material handling means. If desired the loader arm may have more than two telescopically slidable sections or may not be telescopic.

When the loader arm 60 is in its lowermost position, as shown in the Figures, it lies in a well 70 of a minimum width which is greater than the width of the loader arm and provided between the cab 50 and the frame member 15. In this lowermost position the arm is substantially horizontal but is inclined slightly downward in a forward direction.

An internal combustion engine 71 is disposed on the opposite side of the frame member 15 to the well 70 and thus is disposed on the opposite side of the longitudinal axis X—X of the vehicle to the cab 50. The engine 71 is, in the present example, a four cylinder diesel engine having a crankshaft 71c rotatable about an axis C—C which is perpendicular to the longitudinal axis X—X. The crankshaft 71c provides, or is connected to, an output of the engine which is connected to the input of the torque converter 42, or to the input shaft of the gearbox 41 when the torque converter 42 is omitted or provided elsewhere in the drive.

The drive assembly comprising the engine 71, and transmission unit 43 is mounted using the compliant mounts. The transmission unit 43 is mounted relative to the frame member 14 by a conventional vibration isolating mount disposed between the inwardly facing surface of the frame member 14 and the adjacent surface of the gearbox 41. Two further mounts 43a are provided between the outwardly facing surface of the other frame member 15 and lugs formed integrally with the extension part of the transmission unit 43.

The engine 71 is supported in cantilever by virtue of an inwardly facing mounting face 85 of the engine being connected to the first face 41a of the transmission unit 43.

The engine 71 is so arranged that its crankshaft 71c is transverse to the longitudinal axis X—X of the vehicle and the axis of the crankshaft 71c is inclined at, or substantially at 90° to the axis X—X.

However, in another arrangement, if desired, the axis of rotation of the crankshaft of the engine may be arranged transverse to the axis X—X at an angle other than perpendicular to the longitudinal axis The engine is disposed in a housing 72, the top 72a of which at one side extends generally transversely away from the frame member 15 at substantially the top thereof and is inclined downwardly, as best shown in FIG. 2. At the outer edge the housing 72 has a generally vertical side surface 72b and, at the front and rear, downwardly and rearwardly and downwardly and forwardly extending front and rear end faces 72c, 72d respectively. If desired, the housing may be of a different configuration than that described hereinbefore and may be wholly or partly omitted.

Disposed in front of the engine within the housing 72 is a cooling radiator not shown through which coolant of the engine 71 is circulated through pipes, not shown, and the radiator is provided with an hydraulically operated fan, or, if desired, by an electrically or mechanically operated fan to cause flow of cooling air of the radiator, suitable ventilation openings may be provided in the housing 72 for flow of such air. If desired the radiator may be positioned at another position on the vehicle, such as adjacent to the rear thereof.

The width of the chassis is determined by the desired clearance between the chassis and the wheels.

The top of the loader arm 60 in a fully lowered position and at a location alongside the top of a steering wheel in the operator's cab is disposed wholly or substantially wholly below a horizontal plane which is not more than 1 meter, or preferably not more than 0.5 meter above the top of the steering wheel so that the driver's vision is substantially unobstructed by the loader arm. If desired, and as in the present case the top of the boom at said position is wholly below a horizontal plane containing the top of the steering wheel.

The loader arm in its lowered position may be horizontal or may extend forwardly and downwardly.

The loader arm may be telescopic in the direction of the longitudinal axis of the loader arm.

The longitudinal axis of the loader arm may in a substantially horizontal plane when the loader arm is in a position in which the implement engages a horizontal plane on which the ground engageable propulsion means are supported and, if the loader arm is telescopic, the loader arm is fully retracted.

In the specification by "substantially horizontal" we mean that the longitudinal axis is either in a horizontal plane or is in a plane which is inclined upwardly or downwardly to the horizontal at an angle lying the in the range of +5° to −25°.

The engine may be disposed so that at least a major portion of the engine is situated below a plane tangent to the top of the ground engaging propulsion means so as not to interfere with the view of an operator working in the operator's cab.

If desired, the wheels on the front axle may have a different track to the wheels of the rear axle. The wheels of an axle are equidistant from, and on opposite sides of, the longitudinal axis of the vehicle.

If desired the ground engageable propulsion means may comprise endless tracks.

By a "longitudinal axis of the vehicle" we mean an axis which passes through a mid point of the front wheel track and the rear wheel track of the vehicle.

A vehicle embodying the present invention allows a low boom line, provides good access to the engine and provides a more compact drive train than is obtained with a transmission which includes a bevel box between the engine and a gear box disposed so that input and output shafts thereof are disposed longitudinally.

The input to the gear box may be offset from the engine output centre line with an appropriate transfer mechanism therebetween but it is preferred that the input to the gear box is aligned with the output from the engine.

The differential may be positioned on the front and rear axle as desired. In order to minimise the prop shaft angle it is desirable to use a differential which is offset to the engine side on the rear axle.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A material handling vehicle including a frame structure and comprising:
   ground engageable propulsion means,
   a loader arm mounted for up and down swinging movement,
   an operator's cab,
   an engine having an output to provide power for said movement of the loader arm and propulsion of the vehicle, the output of the engine operatively engaging a drive system which connects the output of the engine to the ground engageable propulsion means to propel the vehicle,
   wherein the drive system comprises a transmission unit disposed substantially centrally of the vehicle, the transmission unit including a change-speed gear train, the output of the engine being kinematically connected to an input of the change-speed gear train, the output of the engine and the input of the change-speed gear train being disposed transversely of the vehicle, and the change-speed gear train having an output shaft which is disposed transversely of the vehicle and which drives an angle drive having an output shaft which extends longitudinally of the vehicle, the output shaft of the angle drive kinematically connected to the ground engageable propulsion means.

2. A vehicle according to claim 1 wherein the angle drive includes a first bevel gear mounted for rotation about an axis which extends transversely of the vehicle and is kinematically connected to the output shaft of the change-speed gear train and which is in mesh with a second bevel gear which is mounted for rotation about an axis which extends longitudinally of the vehicle and is kinematically connected to the output shaft of the angle drive.

3. A vehicle according to claim 2 wherein the transmission unit has at least one output defined by an end of the output shaft of the angle drive.

4. A vehicle according to claim 2 wherein the transmission unit has a front output and a rear output.

5. A vehicle according to claim 4 wherein the front output and the rear output of the transmission unit are provided at opposite ends of output shaft of the angle drive.

6. A vehicle according to claim 1 wherein the transmission is provided with a drive connecting device selected from the group comprising a clutch and a torque converter.

7. A vehicle according to claim 6 wherein the drive connecting device is provided at a position selected from the group comprising between the engine and the transmission unit and between the transmission unit and the ground engageable propulsion means.

8. A vehicle according to claim 1 wherein the vehicle includes a front axle and a rear axle, each of the front axle and the rear axle having a ground engageable propulsion means and the propulsion means of at least one of said axles being connected to the output shaft of the angle drive.

9. A vehicle according to claim 8 wherein at least one of said axles has a differential which is connected to the output shaft of the angle drive.

10. A vehicle according to claim 8 wherein the connection of the output shaft of the angle drive to the at least one axle comprises a universal joint disposed at an end of the output shaft.

11. A vehicle according to claim 1 wherein the engine is located on the opposite side of the loader arm longitudinal axis to the cab.

12. A vehicle according to claim 11 wherein the engine is spaced from the cab to define a well between the cab and the engine in which the arm, in a lowered position, can be at least partly accommodated.

13. A vehicle according to claim 1 wherein the vehicle includes a chassis having a pair of spaced longitudinally extending frame members.

14. A vehicle according to claim 13 wherein the engine is disposed substantially on the opposite side of the chassis to the cab.

15. A vehicle according to claim 13 wherein at least one of said chassis side members is relieved locally to clear at least one of the engine transmission and associated components.

16. A vehicle according to claim 13 wherein mounting means are provided between the chassis and at least one of the engine and transmission unit.

17. A vehicle according to claim 1 wherein the longitudinal axis of the loader arm extends forwardly in, or parallel to a vertical plane containing a longitudinal axis of the vehicle.

18. A vehicle according to claim 1 wherein the loader arm is pivotally mounted towards the rear of the machine about a horizontal axis.

19. A vehicle according to claim 1 wherein the cab has a side window which faces transversely across the vehicle at right angles to the longitudinal axis of the loader arm.

20. A vehicle according to claim 1 wherein the top of the loader arm in a fully lowered position and at a location alongside the top of the steering wheel in the operator's cab is disposed wholly or substantially below a horizontal plane which is not more than 1 meter, preferably not more than 0.5 meter, above the top of the steering wheel so that the driver's vision is substantially unobstructed by the loader arm.

21. A vehicle according to claim 1 wherein the top of the boom at said location is wholly or substantially wholly below a horizontal plane containing the top of a steering wheel disposed in the cab.

22. A vehicle according to claim 1 wherein the longitudinal axis of the loader arm lies in a substantially horizontal plane when the loader arm is in a position in which the implement engages the horizontal plane on which the ground engageable propulsion means are supported.

23. A vehicle according to claim 1 wherein the engine is disposed so that a major portion of the engine is situated below a plane tangent to the top of the ground engaging propulsion means so as not to interfere with the view of an operator working in the operator's cab.

24. A vehicle according to claim 1 wherein the ground engageable propulsion means is driven from the engine wholly by a mechanical transmission or a hydrokinetic transmission.

25. A vehicle according to claim 10 wherein the ground engageable propulsion means comprises a front pair of ground engageable wheels disposed adjacent the front of the structure and a rear pair of ground engageable wheels adjacent the rear of the structure.

26. A vehicle according to claim 25 wherein the front pair of wheels are driven from the front output of the transmission unit whilst the rear pair of wheelsare driven from the rear output of the transmission unit.

27. A vehicle according to claim 1, wherein the output of the engine is coaxial with the input of the transmission unit.

28. A material handling vehicle including a frame structure and comprising:
  ground engageable propulsion means,
  a loader arm mounted for up and down swinging movement,
  an operator's cab,
  an engine having an output arranged to provide power for said movement of the loader arm and propulsion of the vehicle,
  a drive system operatively engaging the output of the engine, the drive system comprising a transmission unit which includes a change speed gear train, the output of the engine kinematically connected to an input of the transmission unit, the output of the engine and the input of the transmission unit disposed transversely of the vehicle;
  the change speed gear train including an output shaft which is disposed transversely of the vehicle and which drives an angle drive having an output shaft which extends longitudinally of the vehicle and is kinematically connected to the ground engageable propulsion means, and
  the transmission unit having a front output and a rear output, said front and rear outputs of the transmission unit being provided at opposite ends of the output shaft of the angle drive.

29. A vehicle according to claim 28 wherein the angle drive includes a first bevel gear mounted for rotation about an axis which extends transversely of the vehicle and is kinematically connected to the output shaft of the change speed gear train and which is in mesh with a second bevel gear which is mounted for rotation about an axis which extends longitudinally of the vehicle and is kinematically connected to the output shaft of the angle drive.

30. A vehicle according to claim 29 wherein the output shaft of the angle drive is connected to the second bevel gear.

31. A vehicle according to claim 28 wherein the transmission unit is provided with a drive connecting device selected from the group comprising a clutch and a torque converter.

32. A vehicle according to claim 31 wherein the drive connecting device is provided at a position selected from the group comprising between the engine and the transmission unit and between the transmission unit and the ground engageable propulsion means.

33. A vehicle according to claim 28 wherein the vehicle includes a front axle operatively connected to the front output of the transmission unit and a rear axle operatively connected to the rear output of the transmission unit, each of the front and rear axles having ground engageable propulsion means.

34. A vehicle according to claim 33 wherein each of said axles has a differential.

35. A vehicle according to claim 33 wherein each of the front and rear outputs of the transmission unit is connected to its corresponding axle by a shaft which has a universal joint at least at one end.

36. A vehicle according to claim 28 wherein the transmission unit is disposed substantially centrally of the vehicle.

37. A vehicle according to claim 28 wherein the engine and the operator's cab are located on opposite sides of the loader arm longitudinal axis.

38. A vehicle according to claim 37 wherein the engine is spaced from the operator's cab to define a well between the cab and the engine in which the loader arm, in a lower position, can be at least partly accommodated.

39. A vehicle according to claim 28 wherein the vehicle includes a chassis having a pair of spaced longitudinally extending frame members.

40. A vehicle according to claim 39 wherein the engine and the operator's cab are disposed substantially on opposite sides of the chassis.

41. A vehicle according to claim 39 wherein at least one of the longitudinally extending frame members is relieved locally to clear at least one of the engine and the transmission.

42. A vehicle according to claim 39 wherein mounting means are provided between the chassis and at least one of the engine and transmission unit.

43. A vehicle according to claim 28 wherein a longitudinal axis of the loader arm extends forwardly in, or parallel to a vertical plane containing a longitudinal axis of the vehicle.

44. A vehicle according to claim 28 wherein the loader arm is pivotally mounted towards the rear of the vehicle about a horizontal axis.

45. A vehicle according to claim 28 wherein the operator's cab has a side window which faces transversely across the vehicle at right angles to a longitudinal axis of the loader arm.

46. A vehicle according to claim 28 wherein a top of the loader arm in a fully lowered position and at a location alongside the top of the steering wheel in the operator's cab is disposed wholly or substantially below a horizontal plane which is not more than 0.5 meters above the top of the steering wheel so that the driver's vision is substantially unobstructed by the loader arm.

47. A vehicle according to claim 46 wherein the top of the loader arm at said location is wholly below a horizontal plane containing the top of the steering wheel.

48. A vehicle according to claim 28 wherein a front portion of the loader arm is arranged to receive an implement, and wherein a longitudinal axis of the loader arm lies in a substantially horizontal plane when the loader arm is in a position in which the implement rests on the ground.

49. A vehicle according to claim 28 wherein the engine is disposed so that a major portion of the engine is situated below a plane tangent to a top portion of the ground engaging propulsion means so as not to interfere with the view of an operator working in the operator's cab.

50. A vehicle according to claim 28 wherein the ground engageable propulsion means is driven from the engine wholly by a mechanical transmission or a hydrokinetic transmission.

51. A vehicle according to claim 28 wherein the ground engageable propulsion means comprises a front pair of ground engageable wheels disposed adjacent the front of the structure and a rear pair of ground engageable wheels adjacent the rear of the structure.

52. A vehicle according to claim 51 wherein the front pair of wheels are driven from a front output of the change speed gear train whilst the rear pair of wheels are driven by a rear output of the change speed gear train.

53. A vehicle according to claim 28 wherein the output of the engine is coaxial with the input of the transmission unit.

54. A material handling vehicle having a loader arm and comprising:

a frame supported for rolling movement on a front drive axle and a rear drive axle;

an engine, the engine having an output shaft disposed transversely relative to a longitudinal axis of the vehicle;

a speed change transmission unit arranged to receive motive power from the engine output shaft, the transmission unit having an input shaft and an output shaft, the input shaft of the transmission unit and the output shaft of the transmission unit both oriented parallel to the output shaft of the engine, the input shaft of the transmission unit coaxial with the output shaft of the engine; and an angle drive having an input shaft disposed parallel to the output shaft of the transmission unit and arranged to receive motive power from the transmission unit, the angle drive having only a single output shaft, the output shaft of the angle drive oriented parallel to the longitudinal axis of the vehicle, the angle drive having a front output and a rear output defined by opposite ends of the output shaft of the angle drive, the front and rear outputs arranged to transmit motive power to the front and rear axles.

55. A material handling vehicle comprising:

a frame supported for rolling movement on a front drive axle and a rear drive axle, the frame including a pair of spaced apart frame rails defining a space there between;

a loader arm mounted to the frame and arranged for pivoting movement about a horizontal axis;

an operator's cab;

an engine, a major portion of the engine disposed outboard of a first one of the frame rails, the engine having an output shaft disposed transversely relative to a longitudinal axis of the vehicle;

a speed change transmission unit arranged to receive motive power from the output shaft of the engine, a major portion of the transmission unit disposed in the space between the frame rails, the transmission unit having an input shaft and an output shaft, the input shaft of the transmission unit and the output shaft of the transmission unit both oriented parallel to the output shaft of the engine, the input shaft of the transmission unit coaxial with the output shaft of the engine; and an angle drive having an input shaft disposed parallel to the output shaft of the transmission unit and arranged to receive motive power from the transmission unit, the angle drive having only a single output shaft, the output shaft of the angle drive oriented parallel to the longitudinal axis of the vehicle, the angle drive having a front output and a rear output defined by opposite ends of the output shaft of the angle drive, the front and rear outputs arranged to transmit motive power to the front and rear axles.

56. The vehicle of claim 55, wherein the output shaft of the angle drive is disposed beneath the input shaft of the transmission unit.

57. The vehicle of claim 55, wherein the first frame rail includes a lower surface having a cutout sized to provide clearance between the first frame rail and at least one of the engine and the transmission unit.

* * * * *